United States Patent
Culca

(10) Patent No.: US 11,397,201 B2
(45) Date of Patent: Jul. 26, 2022

(54) CIRCUIT ASSEMBLY AND METHOD FOR MONITORING SINUSOIDAL ALTERNATING VOLTAGE SIGNALS

(71) Applicant: Eaton Intelligent Power Limited, Dublin (IE)

(72) Inventor: Horea Culca, Lohmar (DE)

(73) Assignee: Eaton Intelligent Power Limited, Dublin (IE)

( * ) Notice: Subject to any disclaimer, the term of this patent is extended or adjusted under 35 U.S.C. 154(b) by 25 days.

(21) Appl. No.: 16/764,409

(22) PCT Filed: Nov. 8, 2018

(86) PCT No.: PCT/EP2018/080554
§ 371 (c)(1),
(2) Date: Aug. 27, 2020

(87) PCT Pub. No.: WO2019/096661
PCT Pub. Date: May 23, 2019

(65) Prior Publication Data
US 2020/0393499 A1    Dec. 17, 2020

(30) Foreign Application Priority Data

Nov. 17, 2017 (DE) ...................... 10 2017 127 070.1

(51) Int. Cl.
*G01R 5/14* (2006.01)
*G01R 19/165* (2006.01)
(Continued)

(52) U.S. Cl.
CPC ..... *G01R 19/16547* (2013.01); *G01R 19/175* (2013.01); *H03K 5/1536* (2013.01)

(58) Field of Classification Search
CPC .... G01R 19/0084; G01R 19/04; G01R 19/05; G01R 19/2513; G01R 19/175;
(Continued)

(56) References Cited

U.S. PATENT DOCUMENTS 4,045,732 A * 8/1977 Yashiro .................. G01R 29/04
324/140 D
4,642,748 A * 2/1987 Kirk ........................ H02M 7/10
363/16
(Continued)

FOREIGN PATENT DOCUMENTS

DE    19748632 A1    5/1999
JP    H03189569 A    8/1991

OTHER PUBLICATIONS

Fischer, et al. "Wechselstrom und Drehstrom," *Elektrotechnik fuer Maschinenbauer*, (Dec. 2012): 82-85.

*Primary Examiner* — Thang X Le
(74) *Attorney, Agent, or Firm* — Leydig, Voit & Mayer, Ltd.

(57) ABSTRACT

A circuit assembly for monitoring a sinusoidal alternating voltage signal having a comparing element receiving at an input the signal with period T and generating a first output signal at an output based upon the signal exceeding a threshold; a zero crossing detector receives at its input the signal and generates a output signal at its output; a timing element connected to zero crossing detector generates a clock signal dependent on the second output signal; and a flip-flop. The comparing element output is connected to a state-controlled input of the flip-flop and the timing element output is connected to an edge-controlled input of the flip-flop. The flip-flop generates a state signal at its output. The timing element specifies a state change of the clock signal at an instant that differs from the instant at T/4 after a zero crossing of the signal.

13 Claims, 3 Drawing Sheets

(51) Int. Cl.
　　　*G01R 19/175*　　　(2006.01)
　　　*H03K 5/1536*　　　(2006.01)
(58) Field of Classification Search
　　　CPC ........ G01R 19/16538; G01R 19/16547; H03K
　　　　　　　　　　　　　　　　　　　　　5/153; H03K 5/1536
　　　USPC ..................................................... 324/140 R
　　　See application file for complete search history.

(56) References Cited

U.S. PATENT DOCUMENTS

| | | |
|---|---|---|
| 6,255,864 B1 | 7/2001 | Culca |
| 9,185,761 B2 | 11/2015 | Li et al. |
| 2010/0271073 A1 | 10/2010 | Kluss et al. |
| 2011/0249476 A1* | 10/2011 | Chen ..................... H02H 1/0007 |
| | | 363/52 |
| 2013/0201731 A1* | 8/2013 | Gu ....................... H02M 1/4225 |
| | | 363/21.17 |
| 2017/0117814 A1* | 4/2017 | Adragna ................. H02M 1/08 |
| 2019/0379278 A1* | 12/2019 | Niv ....................... H02M 1/083 |

* cited by examiner

CIRCUIT ASSEMBLY AND METHOD FOR MONITORING SINUSOIDAL ALTERNATING VOLTAGE SIGNALS

CROSS-REFERENCE TO PRIOR APPLICATIONS

This application is a U.S. National Phase Application under 35 U.S.C. § 371 of International Application No. PCT/EP2018/080554, filed on Nov. 8, 2018, and claims benefit to German Patent Application No. DE 10 2017 127 070.1, filed on Nov. 17, 2017. The International Application was published in German on May 23, 2019 as WO 2019/096661 A1 under PCT Article 21(2).

FIELD

The present invention relates to a circuit assembly and a method for monitoring a sinusoidal alternating voltage signal, in particular an input signal of electronic control devices, such as programmable logic controllers (PLC) or logic relays, or an input signal or voltage of similar devices, and a corresponding software product.

BACKGROUND

The product standard for PLCs, IEC/EN 61131, Part 2, defines, among other things, the properties of input signals. DC voltage signals (DC input signals) and sinusoidal alternating voltage signals (AC input signals) are specified as digital inputs. The following voltages are listed here: 24V DC, 48V DC, 24V AC, 48V AC, 100/110/120V AC, 200/230/240VAC.

For small, compact devices (such as control relays), it is desirable to support various supplies and input signals, such as 24V AC and 24V DC. This can reduce the variety of device types. However, the costs for parts and components in such devices are also to be kept as low as possible.

One difficulty in monitoring AC input signals is that the IEC/EN 61131 standard defines the threshold values (AC values) for AC input signals as effective values ($U_{rms}$) and not as peak values. A conventional way of monitoring AC input signals is to rectify and smooth the sinusoidal signals, which creates DC signals (apart from the residual ripple), to compare them to a defined threshold value (using a comparing element) and to make the result available to a CPU or a microcontroller as a digital signal (e.g. TTL level or CMOS level, e.g. 5V or 3.3V; CMOS is the abbreviation for complementary metal-oxide semiconductor). However, the signals generated in this way at a comparing element input correspond to the peak value ($U_{peak}$), not the effective value ($U_{rms}$) of a corresponding input signal.

For example, according to IEC/EN 61131-2, the normalized threshold values (DC values) for 24V DC are defined as $U_{Lmax}$=5V (maximum DC value for a low signal) and $U_{Hmin}$=15V (minimum DC value for a high signal) with corresponding input values of $U_{IN\ Lmax}$=5V (maximum input value for a low signal) and $U_{IN\ Hmin}$=15V (minimum input value for a high signal). For example, according to IEC/EN 61131-2, the normalized threshold values (AC values) for 24V AC are defined as $U_{Lmax,\ rms}$=5V (maximum effective value for a low signal) and $U_{Hmin,\ rms}$=14V (minimum effective value for a high signal) with corresponding rectified and smoothed peak input values ($U_{rms}\sqrt{2}$) of $U_{IN\ Lmax}$=7.07V (maximum peak input value for a low signal) and $U_{IN\ Hmin}$=19.8V (minimum peak input value for a high signal). To monitor the respective high signals and low signals of both AC input signals and DC input signals, a comparing element with a defined threshold value must therefore be used approximately in the middle between 7.07V and 15V, e.g. at 11V.

An inexpensive solution for comparing elements of the type mentioned above are, for example, so-called CMOS HC gates, such as a so-called HC04 inverter. The CMOS HC input thresholds are typically $U_{DD}/2$ ($U_{DD}$ is the supply voltage of the gate), but are normalized according to "JEDEC" (Joint Electron Device Engineering Council) and are $U_{IN,L\ max}$=30% $U_{DD}$ as the maximum level for a low signal (e.g. 1.5V for $U_{DD}$=5V) and $U_{IN,H\ min}$=70% $U_{DD}$ as the minimum level for a high signal (e.g. 3.5V for $U_{DD}$=5V). This means that a threshold value of $U_{DD}/2$ may deviate by ±20% from $U_{DD}$, that is between $0.6 \times U_{DD}/2$ and $1.4 \times U_{DD}/2$. Converted to the 24V DC threshold values of 5V or 15V (see above) an average value of $U_M$=(5V+15V)/2=10V as $U_{DD}/2$ produces:

$U_{IN,L}$=0.6×10V=6V>5V, 1V reserve;
$U_{IN,N}$=1.4×10V=14V<15V, 1V reserve.

A CMOS HC gate may thus be used as a comparing element for 24V DC input signals despite the tolerances of the threshold value.

However, when such CMOS HC gates are used both for monitoring 24V DC input signals and for monitoring 24V AC input signals, the possible threshold value range is reduced from 5V to 15V to 7.07V to 15V (see above). The same calculation in this case results in a mean value of $U_M$=(7.07V+15V)/2=11.035V as $U_{DD}/2$:

$U_{IN,L}$=0.6×11.035V=6.621V<7.07V, too low;
$U_{N,H}$=1.4×11.035V=15.449>15V, too high.

This means that inexpensive CMOS HC gates can no longer be used reliably in this case.

A circuit assembly and a method for detecting AC input signals are already known from EP 0935758, wherein, unlike in the case of the conventional solution mentioned at the beginning, the AC input signals are not filtered, but rather are only converted into corresponding pulses. However, the method known from EP 0935758 also detects the peak values of the input signals by reading sinusoidal AC input signals at an instant T/4 of a period T after a zero crossing, as a result of which the same problems described above arise.

SUMMARY

An embodiment of the present invention provides a circuit assembly for monitoring a sinusoidal alternating voltage signal. The circuit assembly includes a comparing element configured to receive at an input a sinusoidal alternating voltage signal to be monitored having a period T or a signal obtained from the sinusoidal alternating voltage, the comparing element being configured to generate a first output signal at an output based upon the sinusoidal alternating voltage signal, or the signal obtained from the sinusoidal alternating voltage signal, exceeding a specified threshold value; a zero crossing detector that is configured to receive at a monitoring input the sinusoidal alternating voltage signal to be monitored or the signal obtained from the sinusoidal alternating voltage and is configured to generate a second output signal at an output; a timing element connected downstream of the zero crossing detector that is configured to generate a clock signal that is dependent on the second output signal; and an edge-controlled flip-flop. The output from the comparing element is connected to a state-controlled input of the flip-flop and an output of the timing element is connected to an edge-controlled input of the flip-flop, and the flip-flop is configured to generate a state signal at an output of the flip-flop. The timing element is configured to specify a defined state change of the clock signal at an instant which differs from the instant at T/4 of the period T after a zero crossing of the sinusoidal alternating voltage signal.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1A:
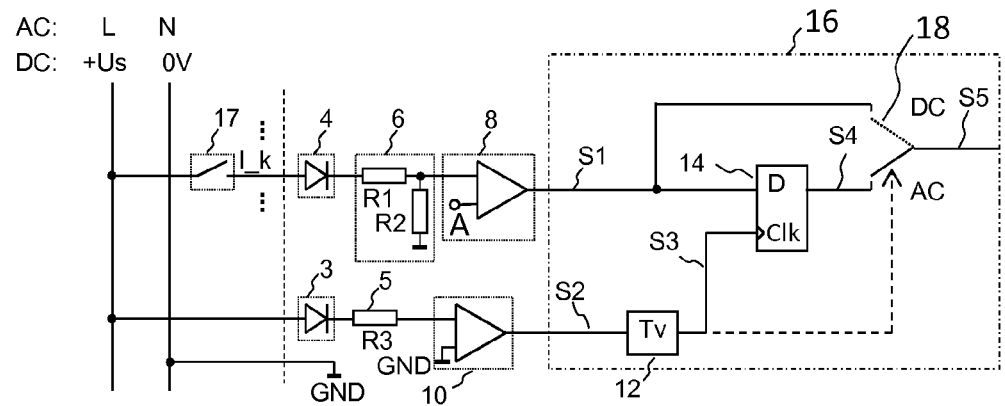
FIGS. 1A and 1B illustrate embodiments of a circuit assembly.

Embodiments of the present invention provide a circuit assembly and a method for monitoring a sinusoidal alternating voltage signal, in particular for devices of the type mentioned at the outset, which enable comparing elements to be used more flexibly.

The circuit assembly, according to an embodiment, has a comparing element to which a sinusoidal alternating voltage signal to be monitored or a signal obtained therefrom may be supplied at an input. The comparing element is configured to generate a first output signal at an output if the sinusoidal alternating voltage signal or the signal obtained therefrom exceeds a defined threshold value. The sinusoidal alternating voltage signal to be monitored may either be fed directly into the comparing element or preprocessed beforehand, so that a signal obtained therefrom may be supplied to the comparing element. A corresponding preprocessing may include rectification by a rectifier (for example for half-wave rectification) or step-down by a step-down converter. The sinusoidal alternating voltage signal to be monitored can be, for example, a voltage signal of one phase of a three-phase supply network.

The circuit assembly also has a zero crossing detector, to which the sinusoidal alternating voltage signal or a signal obtained therefrom may be supplied at a monitoring input, so that a second output signal may be generated at an output of the zero crossing detector. The sinusoidal alternating voltage signal may either be supplied directly into the zero crossing detector or preprocessed beforehand, so that the signal obtained therefrom may be supplied to the zero crossing detector. A corresponding preprocessing may include rectification by a rectifier (advantageously half-wave rectification) analogous to the measures mentioned above. Optionally, the preprocessing may also include a current limitation by means of a resistor or a step-down by a step-down converter.

The circuit assembly also has a timing element connected downstream of the zero crossing detector to generate a clock signal dependent on the second output signal.

The circuit assembly also has an edge-controlled flip-flop. The output of the comparing element is connected to a state-controlled input of the flip-flop. An output of the timing element is connected to an edge-controlled input of the flip-flop. In this way, a state signal may be generated at an output of the flip-flop. Furthermore, the timing element is configured to specify a defined state change of the clock signal at an instant that differs from the instant corresponding to T/4 of a period T after a zero crossing of the sinusoidal alternating voltage signal.

The sinusoidal alternating voltage signal is thus monitored relative to the defined threshold value. The defined threshold value can be predetermined and constant.

Because the defined state change of the clock signal is specified at an instant that differs from an instant corresponding to T/4 of a period T after a zero crossing of the sinusoidal alternating voltage signal, the peak value (peak value or amplitude value) of the sinusoidal alternating voltage signal is not used for the monitoring, but, rather, a value that is lower than the peak value is used for this purpose. Thus, the threshold value that is used for monitoring the sinusoidal alternating voltage signal or that is specified or defined by the comparing element can be lower than a threshold value that would be necessary for evaluating the sinusoidal alternating voltage signal with regard to its peak value. By "shifting" or displacing the instant of evaluation of the sinusoidal alternating voltage signal with respect to the threshold value away from an instant of occurrence of the peak value, the threshold value can in particular be chosen to be lower than the peak value, but an evaluation is nevertheless possible as to whether the sinusoidal alternating voltage signal exceeds a defined threshold or not.

In this way, a comparing element of the type explained above may be used more flexibly with regard to the threshold value used. In particular, it is also possible in this way to use comparing elements that, owing to the tolerances to which they are subjected, specify a threshold value which is lower than the peak value of the sinusoidal alternating voltage signal. In general, comparing elements may be used flexibly in applications which specify or require a specific threshold value, wherein the threshold value is lower than a peak value of the sinusoidal alternating voltage signal to be monitored, and nevertheless a reliable and error-free evaluation of the sinusoidal alternating voltage signal is required.

In various embodiments of the circuit assembly, the timing element is configured to specify a defined state change of the clock signal at an instant corresponding to T/8 or 3T/8 of a period T after a zero crossing of the sinusoidal alternating voltage signal. Because the defined state change of the clock signal in these configurations is specified at an instant corresponding to T/8 or 3T/8 of a period T after a zero crossing of the sinusoidal alternating voltage signal, the instant of the state change of the clock signal correlates with the instant at which an effective value ($U_{rms}$) of the sinusoidal alternating voltage signal or the signal obtained therefrom occurs. As is known, the effective value ($U_{rms}$) is lower than the peak value ($U_{peak}$) of the AC signal to be monitored. In general, $U_{rms}=1/\sqrt{2}U_{peak}$ or $\sin(45°)=1/\sqrt{2}$. The amplitude of the sinusoidal alternating voltage signal at the instant T/8 (45°) thus corresponds exactly to the effective value ($U_{rms}$). The same applies to the instant 3T/8. When the defined state change of the clock signal occurs, the edge-controlled input of the flip-flop is triggered and the output of the comparing element at the state-controlled input of the flip-flop is read/accepted. The first output signal is generated at the output of the comparing element if the sinusoidal alternating voltage signal or the signal obtained therefrom exceeds the defined threshold value. In this way, the effective value of the sinusoidal alternating voltage signal or the signal generated therefrom may be monitored relative to the defined threshold value.

In this embodiment, the circuit assembly makes it possible, in particular, to use, select or dimension a threshold value for monitoring a normalized AC input signal, which is in a threshold value range between the maximum effective threshold value for a low signal and the minimum effective threshold value for a high signal of the sinusoidal alternating voltage signal (see, for example, the signal thresholds explained at the beginning). This has the advantage that a threshold value may be used which is within the permissible limits of a comparing element subject to tolerances and is designed for monitoring a DC voltage signal, even if this threshold value is lower than a maximum peak due to the tolerance of the comparing element value ($U_{peak}$) of the low signal of the sinusoidal alternating voltage signal.

The circuit assembly may be configured such that a DC voltage signal to be monitored or a signal obtained therefrom may be supplied to the comparing element at its input as an alternative to the sinusoidal alternating voltage signal, the comparing element being configured to generate the first output signal at its output if the DC voltage signal or the signal obtained therefrom exceeds the defined threshold value. The circuit assembly thus enables both monitoring of sinusoidal alternating voltage signals (AC input signals) and monitoring of DC voltage signals (DC input signals). All that is needed for this is a comparing element, wherein only a single threshold value has to be defined. This makes it possible for combined monitoring of both sinusoidal alternating voltage signals and DC voltage signals on devices explained at the outset to be carried out using comparing elements which can be easily and flexibly adjusted. In particular, inexpensive comparing elements, such as CMOS HC gates, can be used flexibly. The circuit assembly is nevertheless easy to implement.

For example, a theoretical threshold value of 9.5V may be defined as the mean value between the maximum effective threshold value for a low signal (5V) and the minimum effective threshold value for a high signal (14V) of the sinusoidal alternating voltage signal. According to the above calculation, a tolerance of a CMOS HC gate used as explained at the outset is then:

$U_{IN,L}$=0.6×9.5V=5.7V>5V;

$U_{IN,H}$=1.4×9.5V=13.3V<14V. Thus, despite a tolerance or variability of the actual threshold value of the comparing element used between 5.7V and 13.3V, both the normalized DC values of DC signals (maximum 5V for low signals or minimum 15V for high signals) and the normalized effective threshold values of AC signals (5V for low signals or 14V for high signals) are monitored flawlessly. Other dimensions or evaluation instants are of course conceivable for specific applications.

In various embodiments of the circuit assembly, the comparing element is a comparator, the input being a first comparison input of the comparator for comparing the sinusoidal alternating voltage signal to be monitored or the signal obtained therefrom to the defined threshold value present at a second comparison input of the comparator. A comparator has the advantage over a simpler comparing element, for example a CMOS HC comparing element, that a more precise threshold value may be specified without it being subjected to substantial tolerances.

In various embodiments of the circuit assembly, in particular advantageously using a comparator as a comparing element, the comparing element may alternatively be supplied with different DC voltage signals to be monitored or signals obtained therefrom at its input, the comparing element being configured to generate the first output signal at its output if a corresponding applied DC voltage signal or the signal obtained therefrom exceeds the defined threshold value. The threshold value may be set such that it lies below a peak value of the sinusoidal alternating voltage signal and above a DC value of a respective DC voltage signal. Thus, in addition to the sinusoidal alternating voltage signal, a plurality of different DC signals may alternatively be monitored using a single defined threshold value, even if one or more of the DC signals require a threshold value that is below the peak value of the sinusoidal alternating voltage signal. For example, a combined monitoring of 24V AC, 24V DC and 12V DC is possible, wherein the threshold value is fixed at 6V, for example. The threshold value is therefore below the maximum peak value for a low signal (normalized to 7.07 V) of the sinusoidal alternating voltage signal (and of course also below the minimum peak value of normalized 19.8 V for a high signal of the sinusoidal alternating voltage signal) and above a maximum DC value for a low signal (normalized to 5V) of the respective DC voltage signal (and of course below the minimum DC value of normalized 15V for a high signal of the DC voltage signal). A threshold value of approx. 6V (e.g. 6.4V) has also been monitored for monitoring a maximum lower DC threshold (low signal) or a minimum upper DC threshold (high signal) of a monitored 12V DC signal not defined in the standard IEC/EN 61131-2, taking into account the calculation formula of Appendix B of the standard IEC/EN 61131-2, was found to be sufficient.

In various embodiments of the circuit assembly, the timing element is configured to be triggered by the second output signal to generate the clock signal. The second output signal thus triggers the clock signal.

In various embodiments of the circuit assembly, the flip-flop and/or the timing element are implemented by software within a microcontroller. In this way, a very simple implementation of the circuit assembly or of parts of the circuit assembly in software is possible.

In various embodiments, the circuit assembly has a changeover switch for switching a signal output of the circuit assembly between the output of the flip-flop and the output of the comparing element, the changeover switch being controllable by means of a control signal. This control signal can be, for example, the clock signal of the timing element. Alternatively, the control signal may be the second output signal or a signal obtained therefrom. The changeover switch may be used to switch between monitoring one (or more) DC voltage signal and monitoring a sinusoidal alternating voltage signal. During the monitoring of a DC voltage signal, the signal output of the circuit assembly is switched directly (directly) to the output of the comparing element, so that the first output signal may be output at the output of the circuit assembly if the DC voltage signal or the signal obtained therefrom exceeds the defined threshold value. By contrast, when the sinusoidal alternating voltage signal is monitored, the signal output of the circuit assembly is switched to the output of the flip-flop, so that the state change of the flip-flop may be output at the output of the circuit assembly, which signal may be output via the clock signal of the timing element at T/8 or 3T/8 of a period T after a zero crossing of the sinusoidal alternating voltage signal is triggered. The changeover switch may be controlled via the clock signal of the timing element, for example, in such a way that switching from DC monitoring (DC voltage signal) to AC monitoring (sinusoidal alternating voltage signal) takes place if the clock signal is present, which on its part is triggered by a detection of zero crossings of the sinusoidal alternating voltage signal via the zero crossing detector.

A method, according to an embodiment, includes the following method steps: detecting a sinusoidal alternating voltage signal to be monitored, and checking whether the detected sinusoidal alternating voltage signal or a signal obtained therefrom exceeds a defined threshold value and, dependent on this, generating a first output signal. The method also includes monitoring the zero crossings of the sinusoidal alternating voltage signal or a signal obtained therefrom and, dependent on this, generating a second output signal, generating of a clock signal dependent on the second output signal, and generating a state signal by evaluating the first output signal at the instant of a defined state change of the clock signal, The defined state change of the clock signal is specified at an instant that differs from the instant corresponding to T/4 of a period T after a zero crossing of the sinusoidal alternating voltage signal.

Such a method also easily achieves the advantages shown in connection with a circuit assembly of the type explained above.

In various implementations of the method, the defined state change of the clock signal at an instant at T/8 or 3T/8 is specified for a period T after a zero crossing of the sinusoidal alternating voltage signal. At this point too, the advantages explained above in connection with a circuit assembly apply analogously.

In various implementations of the method, the clock signal is generated by a timing element, which is triggered by the second output signal to generate the clock signal. In this way, the clock signal is triggered dependent on the second output signal, which on its part is obtained from a zero crossing detection of the sinusoidal alternating voltage signal.

In various implementations of the method, the timing element is software-controlled or software-implemented within a microcontroller. The following method steps can be carried out in these implementations:
  generating a first interrupt in the microcontroller via the second output signal,
  starting a timer of the microcontroller when the first interrupt occurs to implement the timing element,
  generating a second interrupt in the microcontroller when the timer expires,
  reading (and optionally storing) as a state signal the value of the first output signal that is present when the second interrupt occurs. Such measures enable particularly simple and rapid processing of the detected sinusoidal alternating voltage signal into the corresponding state signal for further (logical) processing within an electronic device in which the method is implemented.

The following further method steps are carried out in various implementations of the method:
  detecting one (or more different) DC voltage signal to be monitored as an alternative to the sinusoidal alternating voltage signal,
  checking whether the detected DC voltage signal or a signal obtained therefrom exceeds the defined threshold value and, dependent on this, generating the first output signal.

The threshold value is set above or below a peak value of the sinusoidal alternating voltage signal and above a maximum DC value of the DC signal. If the threshold is set below a peak value of the sinusoidal alternating voltage signal and above a DC value of the DC signal, the method may alternatively monitor one or more different DC signals using a single defined threshold value, in addition to the sinusoidal alternating voltage signal, even if one or more of the DC signals require a threshold that is below the peak value of the sinusoidal alternating voltage signal. For example, a combined monitoring of 24V AC, 24V DC and 12V DC is possible, wherein the threshold value is fixed at approx. 6V, for example at 6.4V. The threshold value is therefore below the maximum peak value for a low signal (normalized to 7.07 V) of the sinusoidal alternating voltage signal (and of course also below the minimum peak value of normalized 19.8 V for a high signal of the sinusoidal alternating voltage signal) and above a maximum DC value for a low signal (normalized to 5V) of the respective DC voltage signal (and also below the minimum DC value of normalized 15V for a high signal of the respective DC voltage signal). A threshold value of 6V has also proven to be sufficient for monitoring a lower threshold (low signal) of a monitored 12V DC signal. Here too, the advantages presented in connection with a corresponding circuit assembly of the type explained above result analogously.

The method may be partially or completely implemented in software that is configured to be executed within a microcontroller and that carries out a corresponding method when it is executed. The microcontroller can capture the first and second output signals in real time. The software can run in real time.

All aspects, measures and features of a circuit assembly explained above can be manifested in aspects, measures and features of a method explained above and vice versa.

The circuit assembly and the method of the type described above are advantageously used in an electronic device, in particular in programmable logic controllers, logic relays or similar devices.

Embodiments of the present invention are described below with reference to a plurality of figures.

FIG. 1A shows in principle a circuit assembly which enables processing of an AC input signal (sinusoidal alternating voltage signal) or alternatively a DC input signal (DC voltage signal). In this exemplary embodiment, the AC input signal comes from a phase L of a supply network. The DC input signal comes from a DC source +Us. N or 0V denotes the neutral conductor (for AC) or the reference potential (for DC). The circuit assembly is used, for example, in a programmable logic controller or a logic relay, or the like. A second output signal or zero crossing signal S2 is generated from phase L of the device by a zero crossing detector 10. The zero crossing detector 10 is constructed in FIG. 1A in the form of a comparator which compares the supply voltage to a ground potential GND (zero reference) or an approximate ground potential. In this way, the type of voltage signal applied to phase L can be detected. If an AC input signal is present, the zero crossing detector 10 detects zero crossings and thus recognizes the applied AC input signal. In this case, the zero crossing detector 10 generates the second output signal or zero crossing signal S2. The second output signal or zero crossing signal S2 then triggers the timing element Tv 12, which generates the clock signal S3. If, on the other hand, there is a DC input signal, the zero crossing detector 10 does not detect any zero crossings. In this case, the zero crossing detector 10 does not generate the second output signal or zero crossing signal S2. The timing element Tv 12 is also not triggered in this case and also does not generate the clock signal S3.

The supply voltage (input signal) at phase L is first rectified before it is fed into the zero crossing detector 10. This is illustrated schematically in FIG. 1A in the form of a diode 3. A resistor R3, 5 may be arranged between the diode 3 and the zero crossing detector 10. The diode 3 carries out, for example, a half-wave rectification, so that the zero crossing signal S2 can be generated from the signal obtained from said rectification by the zero crossing detector 10 in accordance with the above explanations. The zero crossing detector 10 is implemented as a comparator.

In FIG. 1A the input signal—representatively an input signal I_k is shown—is rectified (by a rectifier 4), divided down (by a step-down converter 6, in this case in the form of a simple voltage divider having two resistors R1, R2) and compared to a predefined threshold value A. (through a comparator 8) and thus "digitized" as the first output signal S1. The input signal I_k is a voltage signal. The rectifier has a diode 4, which can be implemented discretely. A reference voltage source, specifies the threshold value A. The threshold value A may be constant, for example.

In the event that no zero crossings of the input signal I_k are detected by means of the zero crossing detector 10, the signal S2 and thus the clock signal S3 are not generated either (see the above explanations). In this case, a changeover switch 18 remains in an upper position (DC operation) shown in FIG. 1A. In this position of the changeover switch 18, the output of the comparator 8 (at which the signal S1 is generated) is placed directly on the output S5 of the circuit assembly. The first output signal S1 is thus present at the output S5. If a DC input signal is present, this can be monitored by means of the comparator 8. If the DC input signal exceeds the specified threshold value A, the comparator 8 generates the signal S1 and outputs it by means of the changeover switch 18 directly at the output S5.

In the alternative case that zero crossings of the input signal I_k are detected by means of the zero crossing detector 10, the signal S2 and, thus, the clock signal S3 are also generated (see explanations above). In this case, the changeover switch 18—triggered by the timing element Tv 12 (for example via the clock signal S3 or another control signal, see dashed line in FIG. 1A) —switches to the lower position shown in FIG. 1A (AC operation). In this position of the changeover switch 18, the output of the comparator 8, i.e. the first output signal S1, is fed to the data input D of the flip-flop 14. The clock input Clk is controlled by the generated clock signal S3. In the exemplary embodiment according to FIG. 1A, components 12, 14 and 18 are implemented in a microcontroller 16. The first output signal S1 is connected as the normal input of the microcontroller 16. The zero crossing signal S2 is switched on at an interrupt input of the microcontroller 16.

The generation and function of the clock signal S3 is explained in detail below (see FIG. 1A to FIG. 2). It is assumed here that an AC input signal I_k is present and the changeover switch 18 is placed in AC mode.

Starting from the zero crossing signal S2, the timing element Tv, 12 generates the clock signal S3 as a clock pulse for the flip-flop 14. The clock signal S3 has a defined state change (falling clock edge, see FIG. 2), which occurs after a delay of T/8 or 3T/8 of a period T after a zero crossing of the AC input signal I_k (detected by the zero crossing signal S2). At this instant, the effective value of the sinusoidal AC input signal I_k is present. This can be shown mathematically by the following calculation. The sinusoidal AC input signal corresponds to I_k $$u(t) = U_{peak} \sin(\omega t)$$

with the peak value $U_{peak}$. If this mathematical signal description is solved as follows:

$$\omega t = \arcsin\left(\frac{u(t)}{\sqrt{2}\, U_{rms}}\right)$$

wherein $U_{peak} = \sqrt{2} U_{rms}$ and $U_{rms}$ corresponds to the effective value, the following relationship is obtained for the desired instant $t_x$ at which the effective value $U_{rms}$ is present:

$$\omega t_x = \arcsin\left(\frac{u(t_x)}{\sqrt{2}\, U_{rms}}\right) = \arcsin\left(\frac{U_{rms}}{\sqrt{2}\, U_{rms}}\right) = \arcsin\left(\frac{1}{\sqrt{2}}\right) = \frac{\pi}{4} bzw.$$

$$t_x = \frac{1}{\omega}\frac{\pi}{4} = \frac{T}{8}$$

Then:

$$\sin(\omega t) = \sin\left(\omega t + \frac{\pi}{2}\right)$$

is obtained for the second possible instant $t_x$:

$$\omega t_x = \frac{\pi}{4} + \frac{\pi}{2} = \frac{3\pi}{4} \text{ or } t_x = \frac{1}{\omega}\frac{3\pi}{4} = \frac{T}{2\pi}\frac{3\pi}{4} = \frac{3T}{8}$$

It is thus shown that the effective value of the AC input signal I_k is present at the instants T/8 or 3T/8 of a period T after a zero crossing of the AC input signal I_k.

The clock signal S3 triggers the flip-flop 14 at its edge-controlled input Clk, wherein the value of the first output signal S1 at the data input D of the flip-flop 14 is adopted and, thus, the state signal S4 at the output of the flip-flop 14 is generated at the respective instant of a corresponding state change (falling clock edge) of the clock signal S3 (at T/8 or 3T/8). Alternatively, with a suitable design of the clock signal S3 and the flip-flop 14, a rising clock edge may also be used instead of a falling clock edge. Finally, the state signal S4 is provided at the output S5 (see FIG. 1A) and may be processed further, for example by a logic circuit of the electronic device in which the circuit assembly is used.

If the input signal I_k is equal to zero (switch 17 open), the first output signal S1 of the comparator 8 is always "0" and the value "0" is stored in the flip-flop 14 at each instant. If there is a valid input signal I_k that exceeds the comparison threshold (threshold value A) of the comparator 8, a pulse is generated at the first output signal S1. In the case where a sinusoidal AC input signal I_k (see FIG. 2) is present, the pulse of the output signal S1 is centered with respect to the vertex of the input signal I_k, wherein its width is dependent on the actual amplitude of the AC input signal I_k, i.e. the higher the amplitude, the wider the pulse of the first output signal S1. By evaluation of the first output signal S1 in the flip-flop 14 at an instant T/8 or 3T/8, which is triggered by the clock signal S3 of the timing element Tv, 12, the effective value of the AC input signal I_k relative to the threshold value A can be evaluated. This is explained in more detail below using a borderline case, as illustrated in FIG. 2.

Figure 2:
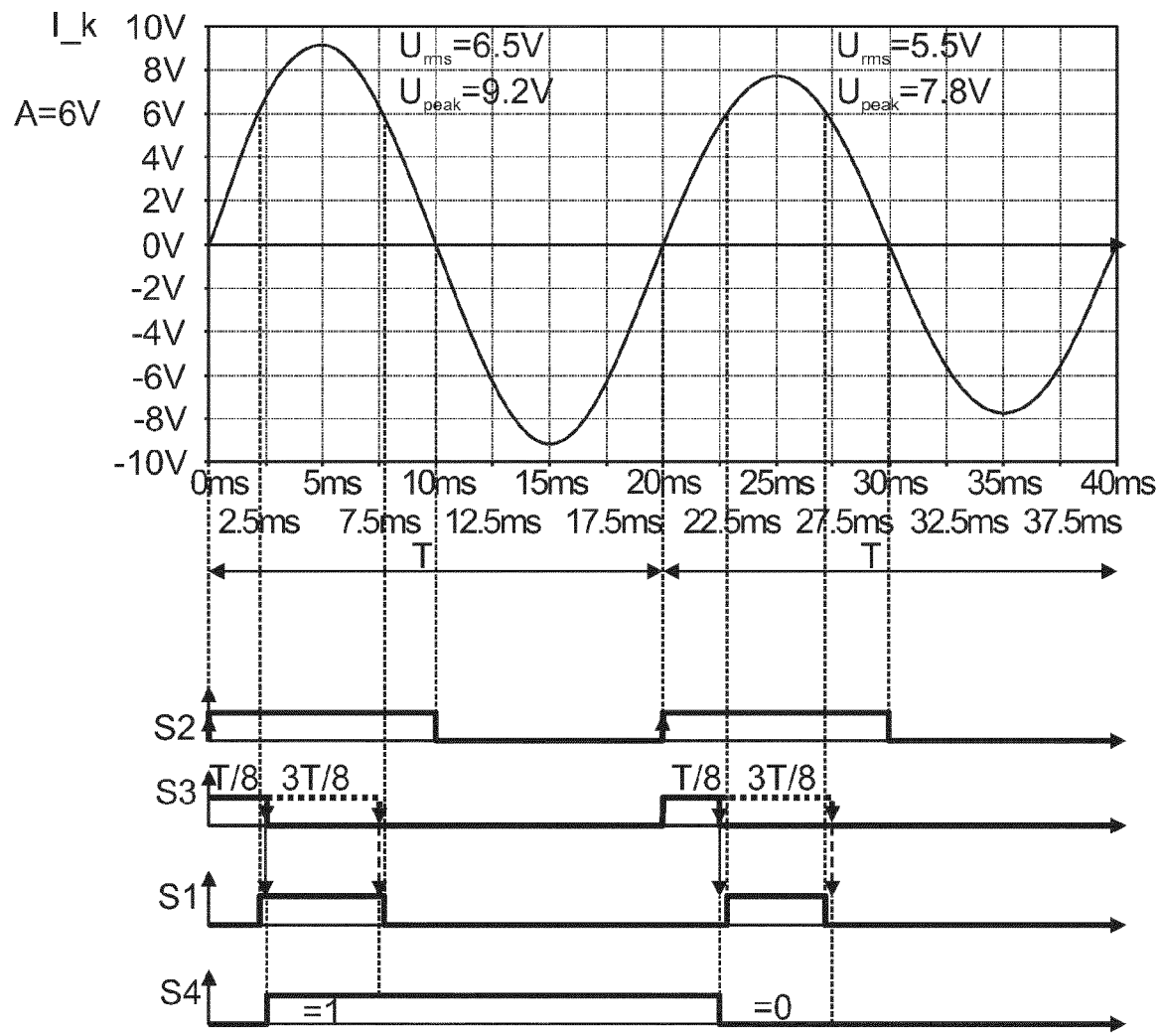
FIG. 2 illustrates an exemplary processing of a sinusoidal alternating voltage signal.

According to FIG. 2, an AC input signal I_k is detected using a threshold value A of 6V. During the first period (0 . . . 20 ms at 50 Hz in this example) the input signal has an effective value $U_{rms}$ of 6.5V, i.e. an amplitude $U_{peak} = \sqrt{2} \times U_{rms}$ of 0.707×6.5V≈9.2V, and is therefore just above the threshold at the instant T/8 or 3T/8. It must be read as "1" because the pulse of output signal S1 is already present at the instant T/8 or 3T/8 (at this instant, S1 was already triggered by comparator 8 because threshold value A had already been exceeded).

During the second period (20 . . . 40 ms) the AC input signal has an effective value $U_{rms}$ of 5.5V, i.e. an amplitude $U_{peak}=\sqrt{2}\times U_{rms}$ of 0.707×5.5V≈7.8V, and, therefore, at the instant T/8 or 3T/8 is just below threshold value A. It must be read as "0" because the pulse of the output signal S1 at the instant T/8 or 3T/8 is not (yet) or is no longer present (at this instant S1 was not yet or was no longer triggered by the comparator 8 because the threshold value A had not yet been exceeded or was no longer exceeded).

As can be seen, by evaluating the AC input signal I_k at T/8 or 3T/8, the effective value of the AC input signal which is lower than the peak value $U_{peak}$ (amplitude value) is taken into account. The AC input signal I_k is read as "1" in the first period, while the AC input signal I_k is read as "0" in the second period. Although the AC input signal I_k exceeds with its peak value $U_{peak}$ (amplitude value) the specified threshold value A in both periods, the AC input signal I_k can be correctly evaluated with respect to its effective value $U_{rms}$ which is taken into account for the threshold A.

The explained mode of operation of the circuit assembly has the advantage that for an alternative evaluation of DC input signals I_k (DC voltage signals) and AC input signals I_k (sinusoidal alternating voltage signals), a threshold value A which is designed for monitoring a DC input signal may be used on the comparator 8 for monitoring a normalized AC input signal, even if this threshold value A is lower than a maximum peak value $U_{peak}$ of an AC input signal I_k, as illustrated in FIG. 2. By evaluating the AC input signal I_k specifically at T/8 or 3T/8, an evaluation is carried out with regard to the effective value $U_{rms}$ of the AC input signal I_k, which is lower than its peak value $U_{peak}$. The circuit assembly thus enables both monitoring of sinusoidal alternating voltage signals (AC input signals) and monitoring of DC voltage signals (DC input signals). Only a comparator 8 is required for this, wherein only a single threshold value A has to be defined. This enables combined monitoring of both AC and DC input signals I_k to be carried out with a comparator 8 that can be easily and flexibly adjusted. The circuit assembly is nevertheless easy to implement.

Alternatively, the comparator 8 may be supplied with a plurality of different AC or DC input signals I_k to be monitored or signals obtained therefrom. The comparator 8 generates the first output signal S1 whenever a respective AC or DC input signal I_k or the signal obtained therefrom exceeds the defined threshold value A. The threshold value A may be set below a peak value of a normalized low signal of a respective sinusoidal AC input signal I_k and above a maximum DC value of a normalized low signal of a respective DC input signal I_k.

For example, the circuit assembly explained allows combined monitoring of 24V AC, 24V DC and 12V DC as the respective input signals I_k, the threshold value A being fixed at approximately 6V, for example at 6.4V. The threshold value A is therefore below a maximum peak value for a low signal (normalized at 7.07 V) of the sinusoidal 24V AC input signal (and also below a minimum peak value, normalized to 19.8V, for a high signal of the sinusoidal 24V AC input signal) and above a maximum DC value for a low signal (normalized to 5V) of the 24V DC input signal (and below a minimum DC value, normalized to 15V, for a high signal of the 24V DC input signal). A threshold value of 6V has also proven to be sufficient for monitoring a lower threshold (low signal) of a monitored 12V DC signal. In this way, different input signals I_k, AC or DC, may be monitored and their normalized threshold values for low and high signals can be flexibly and easily evaluated by the comparator 8 by means of a single threshold value A.

Figure 1B:
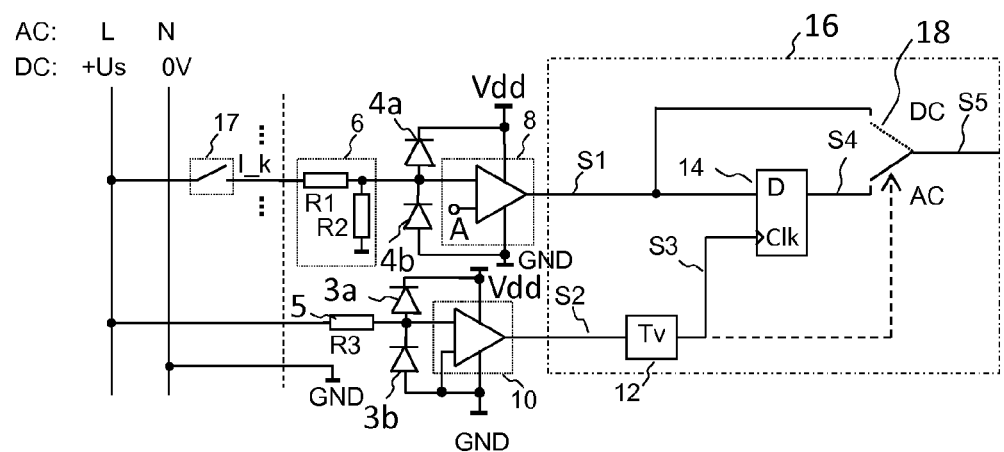

FIG. 1B shows an alternative embodiment of the circuit assembly, which is a further development of the embodiment shown in FIG. 1A. In contrast to FIG. 1A, an applied input signal I_k is first fed to the step-down converter 6 in FIG. 1B. The output signal of the step down converter 6 is rectified by a first and a second diode 4a, 4b. The first diode 4a connects the input of the comparator 8 to a supply voltage connection. A supply voltage Vdd is present at the supply voltage connection. The first diode 4a is polarized such that a voltage across the input of the comparator 8 is less than the supply voltage Vdd (plus a threshold voltage of the first diode 4a). The second diode 4b connects the input of the comparator 8 to a ground potential connection at which the ground potential GND is present. The second diode 4b is polarized in such a way that the voltage across the input of the comparator 8 is larger than the ground potential GND (minus a threshold voltage of the second diode 4b).

The comparator 8 may be implemented as a bipolar comparator. The comparator 8 generates the first output signal S1 dependent on a comparison of the voltage across the input of the comparator 8 and the threshold value A. The first output signal S1 is pulse-shaped. The pulse of the first output signal S1 is detected over time by the microcontroller 16.

Alternatively, the comparator 8 may be implemented as an inverter. The diodes 4a, 4b may, for example, be integrated in the inverter. The diodes 4a, 4b may be implemented as protective diodes. The inverter has a "built-in" threshold value A. The first and the second diode 4a, 4b may optionally be integrated together with the inverter on a semiconductor body (for example, a CMOS inverter of the HC04 type).

To generate the second output signal S2 by means of the zero crossing detector 10, in the exemplary embodiment according to FIG. 1B, an input signal I_k is first supplied to the resistor R3, 5 and then rectified by a first and a second diode 3a, 3b. The first diode 3a connects the input of the zero crossing detector 10 to the supply voltage connection. The first diode 3a is polarized such that a voltage across the input of the zero crossing detector 10 is less than the supply voltage Vdd (plus a threshold voltage of the first diode 3a). The second diode 3b connects the input of the zero crossing detector 10 to the ground potential connection. The second diode 3b is polarized in such a way that the voltage across the input of the zero crossing detector 10 is larger than the ground potential GND (minus a threshold voltage of the second diode 3b). The second output signal S2 is pulse-shaped.

The zero crossing detector 10 may be implemented as a bipolar comparator.

Alternatively, the zero crossing detector 10 may be implemented as an inverter. The diodes 3a, 3b may be integrated in the inverter, for example. The diodes 3a, 3b may be implemented as protective diodes. The zero crossing detector 10 has a "built-in" threshold value. Since the voltage supplied to the zero crossing detector 10 is not divided down, the voltage rise is rapid. The time offset between the zero crossing of the supplied voltage and the switching of the zero crossing detector 10 is very small and can be neglected.

The threshold value of the zero crossing detector 10 can be 0 V (i.e. the ground potential, as in FIG. 1B) or a voltage other than 0 V, for example a small positive voltage (for example 2 V).

In alternative embodiments, the comparator 8 and/or the zero crossing detector 10 may be implemented as a CMOS gate, for example a CMOS gate of the HC type, or as a transistor. In the case of the transistor, the threshold value A may be, for example, that base-emitter voltage above which a current flows through the transistor (for example Ube=approx. 0.65 V). The resistance values of the resistors R1, R2 of the step-down converter 6 are then dimensioned accordingly. Then only the second diodes 4b and 3b can be provided. The first diodes 4a and 3a may be omitted.

The comparator 8 may be produced as a component, to which the diodes 4a, 4b are externally connected upstream as protective diodes, or as a component with integrated diodes 4a, 4b (such as a CMOS inverter with protective diodes such as HC04).

The zero crossing detector 10 may be produced as a component to which the diodes 3a, 3b are externally connected upstream as protective diodes or as a component with integrated diodes 3a, 3b (such as a CMOS inverter with protective diodes such as HC04). The protective diodes may be protective diodes against electrostatic charge, abbreviated as ESD protective diodes.

The preprocessing (rectification, step-down) is only shown by way of example in FIGS. 1A and 1B and may also be implemented with alternative circuits. If necessary, rectification may be omitted. The preprocessing is designed to protect the comparator 8 and/or the zero crossing detector 10 against overvoltages (input>positive supply+tolerance) and undervoltages (input<negative supply, possibly ground potential GND tolerance). This function may optionally also be performed by a rectifier diode 3b, 4b for (negative) undervoltages; if necessary an additional protection against overvoltage may be provided.

Figure 3:
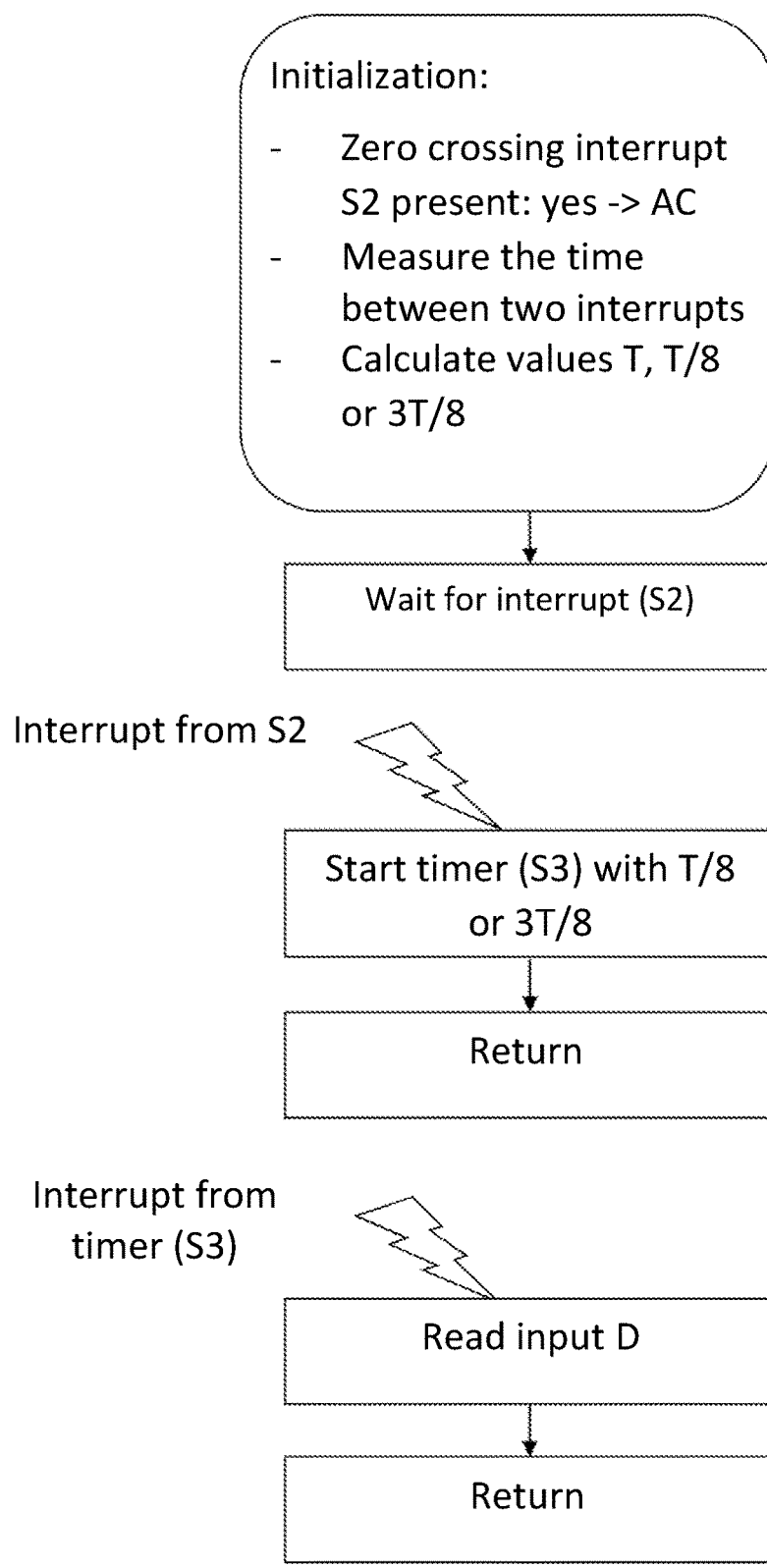
FIG. 3 illustrate a schematic flow diagram of a software-controlled processing.

FIG. 3 shows in principle how the processing of the explained signals and the provision of the corresponding functionalities can be performed in software (within the microcontroller 16). In the following, an AC input signal I_k to be monitored is assumed. In an interrupt routine of the microcontroller 16, which is triggered by an interrupt of the second output signal S2 (zero crossing signal), a timer (signal S3) for implementing the timing element 12 with the value T/8 or 3T/8 is started and at the end (after its expiration) another interrupt is generated. At this instant, the first output signal S1 (of the comparator 8) is read at the input D of the flip-flop 14, and the state signal S4 is correspondingly stored in the memory. A timer can also be called a generator. The interrupt can also be called an interruption.

In order to determine the period T, the zero crossing signal S2 is measured in time when the microcontroller 16 or the device is switched on and initialized (see FIG. 3 above). A timer is used to measure the time intervals between two successive pulses. As a rule, a distinction is made between 50 Hz and 60 Hz, but other frequencies may also be supported. The timer values T/8 or 3T/8 are then calculated.

The illustrated embodiments are only examples. In alternative embodiments, which are indicated by means of dots in FIGS. 1A and 1B, in addition to the explained input signals I_k, at least one further input signal I_k' may be supplied to the circuit assembly. The circuit assembly may comprise at least one further comparator and a further flip-flop connected downstream. The signals of the zero crossing detector 10 and the timing element 12 are suitable for monitoring whether the further input signal I_k' exceeds or falls below the threshold value A. In general, a number of n input signals I_k may be supplied to the circuit assembly and detected. The value n may be 1 or 2 or greater than 2. As explained, the input signals I_k may be AC input signals and/or DC input signals. As an alternative to the explained input signals of 24V AC, 24V DC or 12V DC, other signal values with their (normalized or otherwise defined) thresholds, for example for low or high signals, may of course also be used.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

REFERENCE SIGN LIST 3, 3a, 3b diode
4, 4a, 4b diode
5 resistor
6 step-down converter
8 comparator
10 zero crossing detector
12 timing element
14 flip-flop
16 microcontroller
17 switch
18 changeover switch
A threshold value
D data input of the flip-flop
Clk clock input of the flip-flop
I_k input signal
GND ground potential
L phase
N neutral conductor
S1 first output signal
S2 second output signal
S3 clock signal
S4 state signal
S5 output signal
$U_{rms}$ effective value
$U_{peak}$ peak value
U voltage
+Us DC supply voltage
0V DC reference potential
Vdd supply voltage
T period

The invention claimed is:

1. A circuit assembly for monitoring a sinusoidal alternating voltage signal, the circuit assembly comprising:
   a comparing element configured to receive, at an input of the comparing element, the sinusoidal alternating voltage signal to be monitored having a period T or a signal obtained from the sinusoidal alternating voltage, the comparing element being configured to generate a first output signal, at an output of the comparing element, based upon the sinusoidal alternating voltage signal, or the signal obtained from the sinusoidal alternating voltage signal, exceeding a specified threshold value;
   a zero crossing detector that is configured to receive, at a monitoring input, the sinusoidal alternating voltage signal to be monitored or the signal obtained from the sinusoidal alternating voltage and is configured to generate a second output signal, at an output of the zero crossing detector;
   a timing element connected downstream of the zero crossing detector that is configured to generate a clock signal, at an output of the timing element, that is dependent on the second output signal; and
   an edge-controlled flip-flop,
   wherein the output of the comparing element is connected to a state-controlled input of the flip-flop and the output of the timing element is connected to an edge-controlled input of the flip-flop, and the flip-flop is configured to generate a state signal at an output of the flip-flop, and
   wherein the timing element is configured to specify a defined state change of the clock signal at an instant which differs from the instant at T/4 of the period T after a zero crossing of the sinusoidal alternating voltage signal,
   wherein the defined state change of the clock signal at the instant which differs from the instant at T/4 of the period T after the zero crossing of the sinusoidal alternating voltage signal is a trailing edge state change.

2. The circuit assembly according to claim 1, wherein the timing element is configured to specify the defined state change of the clock signal at an instant corresponding to T/8 or 3T/8 of the period T after the zero crossing of the sinusoidal alternating voltage signal.

3. The circuit assembly according to claim 1, wherein the comparing element is a comparator, and the input of the comparing element is a first comparison input of the comparator for comparing the sinusoidal alternating voltage signal to be monitored or the signal obtained from the sinusoidal alternating voltage signal to the threshold value specified at a second comparison input of the comparator.

4. The circuit assembly according to claim 1, wherein the circuit assembly is further configured to alternatively monitor a direct current (DC) voltage signal received as an input signal to the circuit assembly, wherein the comparing element is configured to be alternatively supplied at its input with the DC voltage signal to be monitored or a signal obtained from the DC voltage signal, the comparing element being configured at its output to generate the first output signal based upon the DC voltage signal or the signal obtained from the DC voltage signal exceeding the specified threshold value.

5. The circuit assembly according to claim 1, the circuit assembly further comprising a changeover switch configured to switch a signal output of the circuit assembly between the output of the flip-flop and the output of the comparing element, wherein the switch is controllable by a control signal.

6. The circuit assembly according to claim 1, wherein the flip-flop is configured to trigger upon detecting, at the edge-controlled input, the defined state change of the clock signal, and is configured to, upon triggering, generate the state signal based upon the output from the comparing element received at the state-controlled input at the time of triggering.

7. The circuit assembly according to claim 1,
   wherein the comparing element comprises a CMOS HC gate,
   wherein the CMOS HC gate of the comparing element is configured to receive at the input the sinusoidal alternating voltage signal to be monitored having the period T or the signal obtained from the sinusoidal alternating voltage,
   wherein the CMOS HC gate of the comparing element is configured to generate the first output signal at the output based upon the sinusoidal alternating voltage signal, or the signal obtained from the sinusoidal alternating voltage signal, exceeding the specified threshold value;
   wherein the wherein the circuit assembly is further configured to alternatively monitor a direct current (DC) voltage signal received as an input signal to the circuit assembly,
   wherein the CMOS HC gate of the comparing element is configured to be alternatively supplied at its input with the DC voltage signal to be monitored or a signal obtained from the DC voltage signal, and
   wherein the CMOS HC gate of the comparing element is configured at its output to generate the first output signal based upon the DC voltage signal or the signal obtained from the DC voltage signal exceeding the specified threshold value.

8. A method for monitoring a sinusoidal alternating voltage signal, the method comprising:
   detecting a sinusoidal alternating voltage signal to be monitored having a period T;
   checking whether the detected sinusoidal alternating voltage signal or a signal obtained therefrom exceeds a specified threshold value and, based on this check, generating a first output signal;
   monitoring zero crossings of the sinusoidal alternating voltage signal or the signal obtained therefrom and, based on this monitoring, generating a second output signal;
   generating a clock signal based on the second output signal; and
   generating a state signal by evaluating the first output signal at an instant of a defined state change of the clock signal,
   wherein the defined state change of the clock signal is specified at an instant which differs from the instant at T/4 of the period T after a zero crossing of the sinusoidal alternating voltage signal,
   wherein the defined state change of the clock signal at the instant which differs from the instant at T/4 of the period T after the zero crossing of the sinusoidal alternating voltage signal is a trailing edge state change.

9. The method according to claim 8, wherein the defined state change of the clock signal is specified at an instant corresponding to T/8 or 3T/8 of the period T after the zero crossing of the sinusoidal alternating voltage signal.

10. The method according to claim 8, wherein the clock signal is generated by a timing element which is triggered by the second output signal to generate the clock signal.

11. The method according to claim 9, wherein the timing element comprises software controlled within a microcontroller, which when executed operates to:
- generate a first interrupt in the microcontroller by the second output signal,
- start a timer of the microcontroller to implement the timing element based upon the first interrupt occurring,
- generate a second interrupt in the microcontroller based upon the timer expiring, and
- based upon the second interrupt occurring, reading the value of the first output signal that is present as a state signal.

12. The method according to claim 8, the method further comprising:
- detecting a DC voltage signal to be monitored as an alternative to the sinusoidal alternating voltage signal, and
- checking whether the detected DC voltage signal or a signal obtained therefrom exceeds the specified threshold value and, dependent on this, generation of the first output signal.

13. A non-transitory computer readable medium comprising a computer program that is configured to be executed within a microcontroller and which, when executed, carries out the method according to claim 8.

* * * * *